United States Patent
Bossler et al.

(10) Patent No.: US 10,501,107 B2
(45) Date of Patent: Dec. 10, 2019

(54) METHOD AND DEVICE FOR DETECTING STEERING WHEEL CONTACT

(71) Applicant: TRW Automotive Safety Systems GmbH, Aschaffenburg (DE)

(72) Inventors: Hans-Jürgen Bossler, Münster (DE); Martin Kreuzer, Kleinwallstadt (DE); Guido Hirzmann, Sailauf (DE); Alexander Lammers, Mühltal (DE); Helga Heist, Laufach (DE)

(73) Assignee: TRW AUTOMOTIVE SAFETY SYSTEMS GMBH, Aschaffenburg (DE)

( * ) Notice: Subject to any disclaimer, the term of this patent is extended or adjusted under 35 U.S.C. 154(b) by 65 days.

(21) Appl. No.: 15/522,017

(22) PCT Filed: Nov. 9, 2015

(86) PCT No.: PCT/EP2015/002240
§ 371 (c)(1),
(2) Date: Apr. 26, 2017

(87) PCT Pub. No.: WO2016/071002
PCT Pub. Date: May 12, 2016

(65) Prior Publication Data
US 2017/0334477 A1    Nov. 23, 2017

(30) Foreign Application Priority Data
Nov. 7, 2014   (DE) .................. 10 2014 016 422

(51) Int. Cl.
*G01R 27/26* (2006.01)
*H03K 17/96* (2006.01)
(Continued)

(52) U.S. Cl.
CPC ............. *B62D 1/046* (2013.01); *B62D 1/065* (2013.01); *G01D 5/2417* (2013.01);
(Continued)

(58) Field of Classification Search
CPC ............... G01R 27/2605; B60K 37/06; B60K 2350/928; B60K 2350/1024;
(Continued)

(56) References Cited

U.S. PATENT DOCUMENTS 5,453,929 A * 9/1995 Stove .................. A61B 5/18
                                                    340/571
5,722,686 A * 3/1998 Blackburn ........ B60R 21/21658
                                                    280/731

(Continued)

FOREIGN PATENT DOCUMENTS

DE  102009058138  6/2011
WO  2014068008   8/2014

*Primary Examiner* — Alesa Allgood
(74) *Attorney, Agent, or Firm* — Tarolli, Sundheim, Covell & Tummino LLP

(57) ABSTRACT

A device for detecting steering wheel contact comprises at least a first electrode (12) which is provided in a steering wheel (10) and which forms, together with a human body acting as a second electrode and a dielectric situated therebetween, at least one sensor capacitor (26). The device also comprises an evaluation circuit (24) having a reference capacitor (30) of known capacitance which can be connected parallel to the sensor capacitor (26), a direct current voltage source (34) which can be connected to the reference capacitor (30), and a measuring device for measuring the voltage at the reference capacitor (30). A method for detecting steering wheel contact using such a device comprises the following successive steps: charging the reference capacitor (30) by applying a known reference voltage, or charging the reference capacitor (30) and subsequently measuring a first voltage at the reference capacitor (30); connecting, in par-
(Continued)

allel, the sensor capacitor (26) to the reference capacitor (30) so that a portion of the charge of the reference capacitor (30) is transmitted to the sensor capacitor (26); measuring a second voltage at the reference capacitor (26); end determining the capacitance of the sensor capacitor (26) from the known capacitance of the reference capacitor (30), the reference voltage or the first voltage and the second voltage.

25 Claims, 2 Drawing Sheets

(51) Int. Cl.
  *B62D 1/04* (2006.01)
  *H03K 17/955* (2006.01)
  *B62D 1/06* (2006.01)
  *G01D 5/241* (2006.01)
(52) U.S. Cl.
  CPC ......... *H03K 17/955* (2013.01); *H03K 17/962* (2013.01); *H03K 2217/960725* (2013.01)
(58) Field of Classification Search
  CPC .... B60K 2350/1028; B60K 2350/1032; B60K 2350/1036; B60K 28/04; G06F 3/044; B60R 2011/001; B60W 10/20; G01D 5/24

See application file for complete search history.

(56) References Cited

U.S. PATENT DOCUMENTS

| | | | |
|---|---|---|---|
| 6,466,036 B1 | 10/2002 | Philipp | |
| 8,836,350 B2 | 9/2014 | Peter | |
| 9,132,850 B2* | 9/2015 | Virnich | B60N 2/5685 |
| 2002/0170900 A1* | 11/2002 | Braeuchle | B62D 1/06 |
| | | | 219/204 |
| 2004/0267422 A1 | 12/2004 | Bossler et al. | |
| 2005/0242965 A1* | 11/2005 | Rieth | B62D 1/046 |
| | | | 340/575 |
| 2008/0111714 A1* | 5/2008 | Kremin | G06F 3/044 |
| | | | 341/33 |
| 2009/0224776 A1 | 9/2009 | Keith | |
| 2013/0058061 A1* | 3/2013 | Satoh | H01B 1/16 |
| | | | 361/760 |
| 2014/0175078 A1 | 6/2014 | Davignon et al. | |
| 2014/0253151 A1 | 9/2014 | Kandler et al. | |
| 2015/0048845 A1* | 2/2015 | Petereit | H03K 17/955 |
| | | | 324/663 |
| 2016/0096543 A1* | 4/2016 | Naitou | B62D 1/065 |
| | | | 219/204 |

* cited by examiner

METHOD AND DEVICE FOR DETECTING STEERING WHEEL CONTACT

RELATED APPLICATIONS

This application corresponds to PCT/EP2015/002240, filed Nov. 9, 2015, which claims the benefit of German Application No. 10 2014 016 422.5, filed Nov. 7, 2014, the subject matter, of which are incorporated herein by reference in their entirety.

BACKGROUND OF THE INVENTION

The invention relates to a device for detecting steering wheel contact. The invention further relates to a method for detecting steering wheel contact by means of such device.

Apart from optical detecting systems, there are basically two options of sensory detection of steering wheel contact by capacitance and by resistance, in resistive systems, an electric signal is generated by the pressure of the hand onto the steering wheel. Influences by differently tight or less tight leather wrappings and thus different initial forces acting on the sensor impede an unambiguous sensing.

In capacitive systems, currently failure-free sensing is not yet possible or possible only with major technical expenditure. Problems such as insufficient grounding, temperature influences and sensing of the initial condition upon starting the vehicle have to be solved. Especially, the sensors strongly tend to drift. In known "open" systems in which the human body forms a capacitor electrode having a variable distance from an electrode which is fixedly arranged in the steering wheel and the evaluation of which is based on an oscillating circuit, the shift of frequency (detuning of the oscillating circuit) is measured. However, already approach of the steering wheel is frequently assessed as a contact so that reliable sensing of a true contact is not ensured.

From U.S. Pat. No. 8,836,350 B2 a method of capacitive contact sensing is known which was developed for the interrogation of touch-sensitive keyboards. Within the scope of contact sensing, the voltage at an internal capacitor of an integrated circuit which is adapted to be coupled to an external capacitor is monitored.

DE 10 2012 024 903 A1 illustrates a planar formation comprising a carrier, at least two electric functional elements and at least one seam in which the strand-type functional elements are integrated. Such planar formation is intended to be used especially in electric heating units.

SUMMARY OF THE INVENTION

It is the object of the invention to permit reliable and robust detection of steering wheel contact.

This object is achieved by a device comprising the features of claim 1 as well as by a method comprising the features of claim 20. Advantageous and useful configurations of the device according to the invention and the method according to the Invention are stated in the related subclaims.

The device according to the invention for detecting steering wheel contact comprises at least a first electrode which is arranged in a steering wheel and which forms, together with a human body acting as a second electrode and a dielectric situated therebetween, at least one sensor capacitor. The device according to the invention further comprises an evaluation circuit having a reference capacitor of known capacitance which can be connected parallel to the sensor capacitor, a direct current voltage source which can be connected to the reference capacitor, and a measuring device for measuring the voltage at the reference capacitor.

As compared to a "closed" system in which two opposite electrodes are installed in the steering wheel which have to be moved towards each other by pressure for generating an output signal and therefore require a highly elastic dielectric, the device according to the invention provides an "open" system in which the human body is used as second capacitor electrode. By approaching and finally contacting the steering wheel the capacitance of the sensor capacitor formed in this way is significantly changed. Hence a second capacitor electrode in the steering wheel can be dispensed with and the required constructional modifications within the steering wheel are kept to a minimum. The structure of the evaluation means according to the invention allows, thanks to including the reference capacitor switchable in parallel to the sensor capacitor, reliable and robust sensing of steering wheel contact even in variable conditions, especially as regards temperature (drift), humidity etc. The typical problems in monitoring oscillating circuits do not occur in the device according to the invention, as it is based on direct current voltage only which can be advantageously tapped from the vehicle power supply and no frequencies have to be measured. The device according to the invention as a whole can be materialized in a very cost-efficient manner and is easy to scale. The results of evaluation can be transmitted to various vehicle assistance systems so as to appropriately influence the control thereof.

The fact that the evaluation circuit may be arranged at least in part on a chip contributes to the compact structure of said evaluation circuit in particular, the arrangement of the reference capacitor on a chip is advantageous as the chip offers protection against external influences.

The at least one first electrode of the sensor capacitor is formed, in the preferred embodiments of the invention, by an electric conductor disposed in a steering wheel rim of the steering wheel.

The electric conductor from which the first electrode is formed may include one or more wires which may be e.g. commercially available enameled wires. Wires basically can be easily bent and shaped into a form suited for an electrode.

However, also one or more conductive tapes or bundles of plural strands may be used as electric conductor.

According to a particular embodiment of the invention, the electric conductor includes an electrically conductive lacquer or an electrically conductive paste. Applying such lacquer or such paste to a carrier enables the first electrode to be freely shaped. It is another advantage that the lacquer or paste can be applied already before foaming to the blank which later forms the foam-coating of the steering wheel armature or can be introduced into the tool. This may offer advantages in terms of processing vis-à-vis a later Introduction of the first electrode.

Another option to provide the electric conductor for the first electrode is the use of a (pre-fabricated) metal plate or film.

According to the preferred embodiments of the invention, the electric conductor is arranged inside a foam-coating which surrounds a steering wheel armature. There the electric conductor is largely protected against mechanical wear and other perturbations. In addition, the external portion of the foam-coating facing away from the steering wheel armature constitutes a portion of the dielectric of the sensor capacitor, which is advantageous with respect to the insulating properties of the foam-coating.

Basically, also other embodiments are possible in which the electric conductor is applied to a foam-coating surrounding a steering wheel armature. The electric conductor may be applied either to the inside facing the steering wheel armature or to the outside facing away from the steering wheel armature.

For example, the electric conductor may be arranged directly beneath an outer wrapping of the steering wheel rim, e.g. a leather or imitation leather wrapping. The term wrapping is intended to comprise also decorative attaching parts e.g. made from plastic, wood composite, textile etc.

Based on a drawn-out base material (wires, tapes etc.), the electric conductor may extend substantially along the toroidal circumferential direction of the steering wheel rim or substantially along the poloidal circumferential direction of the steering wheel rim. "Substantially" in this context shall mean that curvatures are allowed or even desired as long as the electric conductor on the whole extends in the respective given direction.

According to a further development of the invention, the electric conductor is part of a metallic fabric or a metallic knit fabric. Such fabrics or knit fabrics are more flexible as compared to metal plates and adapt better to their bearing surface.

In another embodiment of the first electrode, the electric conductor is applied to a carrier, especially to a textile, a mat or a film.

The electric conductor which in the latter case is preferably formed by thread-like wires can be fastened, as in the case of embroidering, by means of pulling through or stitching on one side or both sides of the carrier. Such electrically conductive planar formations have proven, inter alia, in electric steering wheel heating systems, but they can also be utilized as capacitor electrode within the scope of the invention.

The electric conductor from which the first electrode of the sensor capacitor is formed need not necessarily consist of metal or a metal alloy. The electric conductor may also be made from a semiconductor material.

In order to minimize electric Interferences and thus the error-proneness of the device according to the invention and, resp., to improve the quality of the results a shielding Is desirable. Passive shielding may be provided by a metallic armature of the steering wheel or an electric conductor sandwiched between the steering wheal armature and the first electrode which is placed on a constant potential or on ground.

Active shielding may be achieved by arranging the evaluation circuit so that a metallic armature of the steering wheel or an electric conductor sandwiched between the steering wheel armature and the first electrode is charged to a predetermined potential when the sensor capacitor and the reference capacitor are connected in parallel.

For a more sophisticated and more differentiated evaluation which exceeds mere sensing of steering wheel contact, the invention provides a plurality of first electrodes arranged to be spread over the steering wheel rim which are galvanically isolated from each other, in this way, the number of evaluable sensor capacitors is adequately increased. Depending on the number and the arrangement of the first electrodes, conclusions about the concrete point of the steering wheel contact can be drawn. Moreover, it is possible to sense whether one or two hands are in contact with the steering wheel and also patterns of movement may be sensed.

The invention also provides a method of detecting steering wheel contact using the afore-defined device according to the invention. The method comprises the following successive steps:

charging the reference capacitor by applying a known reference voltage or charging the reference capacitor and subsequently measuring a first voltage at the reference capacitor;

connecting, in parallel, the sensor capacitor to the reference capacitor so that a portion of the charge of the reference capacitor is transmitted to the sensor capacitor;

measuring a second voltage at the reference capacitor; and determining the capacitance of the sensor capacitor from the known capacitance of the reference capacitor, the reference voltage or the first voltage and the second voltage.

As afore-mentioned already, appropriately including the reference capacitor of known constant capacitance ensures that also minor changes of the capacitance of the sensor capacitor can be reliably detected.

Prior to charging the reference capacitor and transfer of charge from the reference capacitor to the sensor capacitor, at least the sensor capacitor is completely discharged. During charge transfer, the reference capacitor is separated from the direct current voltage source, of course.

In order to sense especially variations of the capacitance of the sensor capacitor from which movements of the driver, especially of his/her hand or fingers, may be concluded, the afore-mentioned method steps have to be continuously repeated.

For high resolution of the detection the time interval between the repetitions of the method steps should be as short as possible, preferably be in the range of milliseconds.

For suppressing interferences and enhancing the quality of the method according to the invention, during connection in parallel of the sensor capacitor and the reference capacitor an electric conductor serving as (active) shielding within the steering wheel, for example the metallic steering wheel armature, can be charged to a predetermined potential suited for suppressing interferences.

Within the scope of evaluation, at least one threshold value for the capacitance of the sensor capacitor preferably based on empirically established experience values can be resorted to for reproducible sensing of steering wheel contact.

The evaluation circuit may be easily extended so as to monitor plural sensor capacitors, more exactly plural first electrodes. This enables a more sophisticated and differentiated evaluation which exceeds mere sensing of steering wheel contact. Depending on the number and arrangement of the first electrodes, conclusions about the concrete point of steering wheal contact can be drawn, it is further possible to sense whether one hand or two hands rest(s) on the steering wheel and also patterns of movement can be sensed.

BRIEF DESCRIPTION OF THE DRAWINGS

Further features and advantages of the invention will be resulting from the following description and from the enclosed drawings which are referred to, and wherein.

DESCRIPTION

Figure 1:
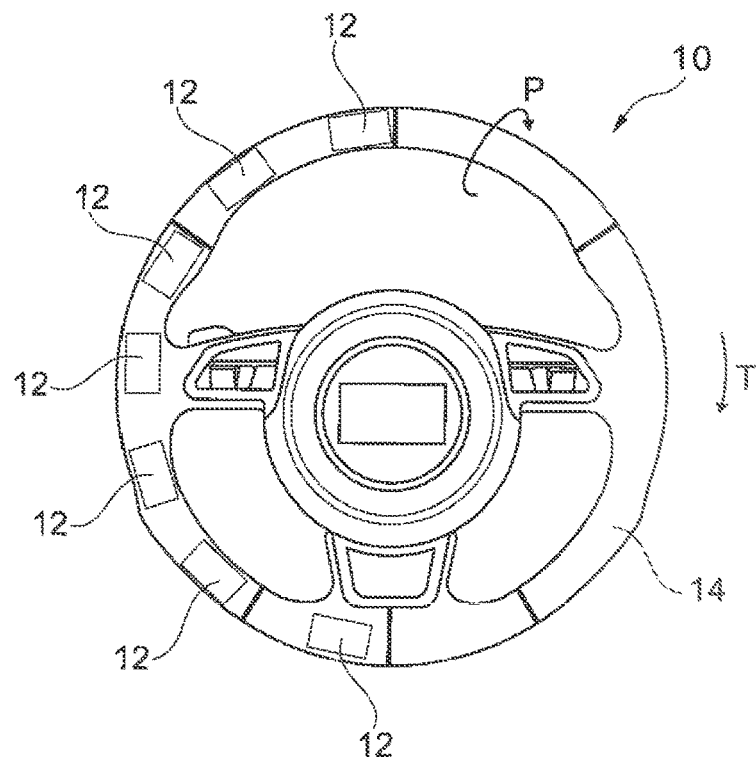
FIG. 1 shows a vehicle steering wheel comprising schematically shown spread electrodes of a device according to the invention for detecting steering wheel contact.

For capacitive detection of a contact of a steering wheel 10 in a motor vehicle, as exemplified in FIG. 1, at least one sensor capacitor is required which is configured to be "open" for detecting steering wheel contact in the device described hereinafter.

An electrically conductive surface which is arranged to be fixed in the steering wheel rim 14 and is not visible from outside serves as a first electrode 12 of the sensor capacitor. (For the purpose of illustration in the left half of FIG. 1 plural points of the steering wheel rim 14 are schematically marked where first electrodes 12 may be provided according to an exemplary arrangement.) Examples of different options of designing and arranging the first electrode 12 will later be described in detail.

A second electrode is constituted by the human body of the driver. Accordingly, the distance between the first electrode 12 and the second electrode is variable. The distance between the two electrodes is minimal when the driver, especially his/her finger or hand, contacts the steering wheel 10 directly above the first electrode 12.

The dielectric of the sensor capacitor is formed by the layers of the steering wheel rim 14 including the wrapping 20 following the first electrode 12 radially outwardly, and possibly by the air between the wrapping 20 and the hand of the driver.

Figure 2:
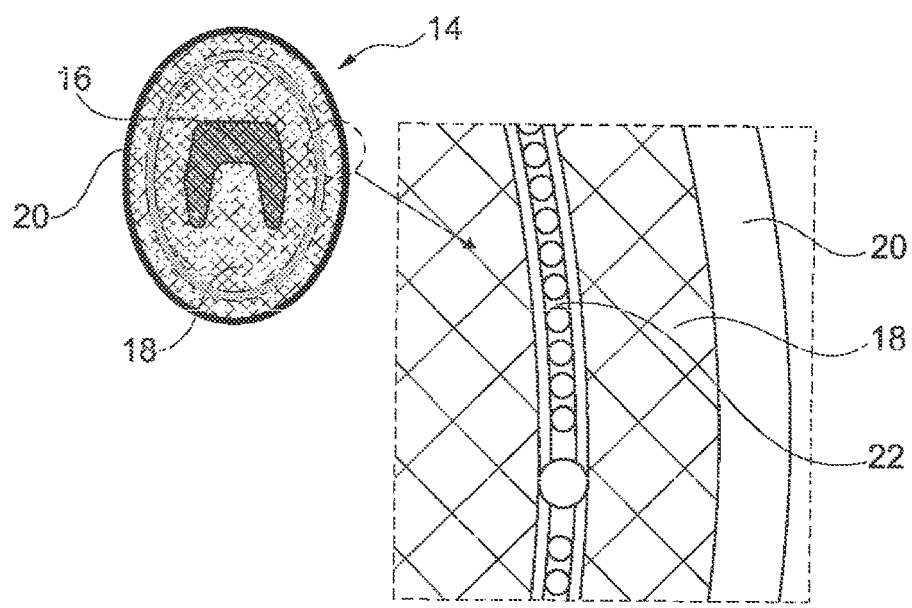
FIG. 2 shows a schematic section across the rim of the steering wheel from FIG. 1 including an enlarged detail.

FIG. 2 illustrates a section across the steering wheel rim 14 including an enlarged detail. A metallic steering wheel armature 16 is surrounded by a plastic foam-coating 18, e.g. polyurethane (PUR). The foam-coating 18 in turn is covered by a wrapping 20 of leather, imitation leather, wood, fabric, lacquer, plastic, rubber or any other electrically non-conductive material. As a matter of course, the steering wheel rim 14 itself may have further components which are of minor importance in this context, however.

As mentioned already, in the steering wheel rim 14 at least a first electrode 12 is provided. It may be formed, as evident from the enlarged detail of FIG. 2, by a plurality of interconnected wires 22 which are arranged inside the foam-coating 18. Instead of plural wires 22, also only one single, possibly multiply wound wire 22 may be provided. To simplify matters, in the following always a plurality is assumed.

In the embodiment of FIG. 2, the wires 22 extend longitudinally with respect to the toroidal peripheral direction T of the steering wheel rim 14. The wires 22 may just as well extend transversely thereto and may wind completely or at least partially in the poloidal peripheral direction P around the steering wheel armature 16. In both cases, only the basic direction of the wires 22 is indicated, i.e. a wave-shaped or meandering course is to be comprised in each case.

In any case, it is important that the wires 22 in total are arranged so that they form more or less an electrically conductive area which may act as a capacitor electrode.

It is desirable that the wires 22 do not rest on the inside and/or the outside of the foam-coating 18, where they might get out of place or might be felt by the driver, but are arranged within the foam-coating 18. Basically, the wires 22 may be introduced to the foam-coating 18 either before or after foaming. In the later case, the foam-coating 18 has to be subsequently cut. For retaining the wires 22 safely and reliably within the foam-coating 18 a special method of Introducing them may be applied which ensures quick and uniform laying of the wires 22. Accordingly, the wires 22 are simultaneously introduced into said cut directly when the foam-coating 18 is cut so that no additional working step is required for bending the cutting edges apart again for inserting the wires 22, for example.

The wires 22 may be coated with an insulating enamel layer (e.g. enameled copper wire) and/or may be part of a metallic fabric or a metallic knit fabric. Fabric and knit fabric in this context are generally meant to be any more or less two-dimensional structure of wires or the like, especially single- or multi-layer fabric as well as knitted fabrics.

Moreover, the wires 22 may also be applied to a carrier. Especially as a first electrode 12 a planar formation is suited, as is it used in an electric steering wheel heating system. Such planar formation includes a carrier which may preferably be flat and at least partly a textile, a mat or a film. The wires 22 may be fastened like threads on one or both sides to the carrier by means of pulling through or stitching. The course and the area covered by the wires 22 on the carrier should be chosen so that they may act as capacitor electrode.

Instead of wires 22, also other electric conductors such as electrically conductive tapes, bundles of plural strands or the like may be used for forming the first electrode 12.

In a different variant, the first electrode 12 is formed of an electrically conductive lacquer or an electrically conductive paste. The lacquer or the paste may basically be applied to the inside facing the steering wheel armature 16 or on the outside of the foam-coating 18, e.g. directly beneath the wrapping 20. In the latter case the lacquer or the paste can be directly applied to the blank before the latter is foamed.

Another possible configuration of the first electrode 12 is a metal plate or film which is sandwiched between the foam-coating 18 and the wrapping 20.

Instead of a metal or an alloy, also a semiconductor material may be used for the electric conductor.

If during detection of steering wheel contacts spatial resolution is desired, according to the schematic representation of the left half of FIG. 1 plural first electrodes 12 which are arranged to be spread in the toroidal peripheral direction T of the steering wheel rim and which are simultaneously monitored may be provided. The first electrodes 12 may additionally (further) be spread in the poloidal peripheral direction P of the steering wheel rim 14 and/or arranged only at positions of the steering wheel rim 14 selected according to particular criteria.

Hereinafter the detection of steering wheel contact by the driver using the first electrode 12 arranged in the steering wheel rim 14 will be described. The detection is based on the change of capacitance of the sensor capacitor which occurs when the driver, especially his/her hand or finger, acting as a second electrode approaches the first electrode 12.

Figure 3:
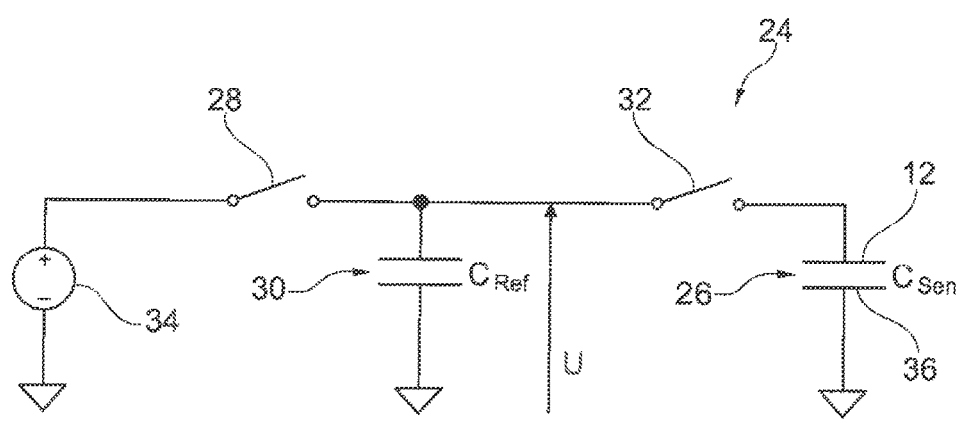
FIG. 3 shows a simplified diagram of an evaluation circuit of the device according to the invention.

FIG. 3 illustrates the basic structure of an evaluating circuit 24 which is employed in the device described here. The sensor capacitor is generally symbolized by 26 in this case. The second electrode thereof variable at a distance from the first electrode 12 which is formed by the human body of the driver is denoted with 36 in this case.

By means of a first switch 32 the sensor capacitor 26 may be connected in parallel to at least one reference capacitor 30. The reference capacitor 30 has a known capacitance $C_{Ref}$ and may be arranged, together with further components of the evaluation circuit 24, on a chip (IC), for example as part of an A/D converter. The capacitance $C_{Ref}$ of the reference capacitor 30 is selected so that it is approximately within the range of the capacity $C_{sen}$ of the sensor capacitor 26 when steering wheel contact occurs.

Via a second switch 28 a direct current voltage source 34 may be connected to the reference capacitor 30. By means of a measuring device the respective voltage at the reference capacitor 30 can be measured.

By way of the following remarks, the basic measuring principle will be illustrated. By closing the second switch

28, a known reference voltage $U_{Ref}$ is applied to the reference capacitor 30. According to the equation $$Q = C_{Ref} * U_{Ref1}$$

the reference capacitor 30 stores a charge Q. Alternatively, the reference capacitor 30 may be charged and a first voltage may be measured at the reference capacitor 30 after the charging operation, the voltage being equally denoted with $U_{Ref1}$ to simplify matters.

By opening the second switch 28 and closing the first switch 32, the reference capacitor 30 is separated from the direct current voltage source 34 and is connected in parallel to the sensor capacitor 26 which has been completely discharged before. In this switching condition, charge equalization takes place in which part of the charge Q of the reference capacitor 30 is transferred to the sensor capacitor 26 connected in parallel. For said charge transfer about 20 milliseconds are calculated.

The total charge Q remains constant in the operation, but it is divided to the two capacitors 26, 30 now ($Q=Q_{Ref}+Q_{Sen}$). On the other hand, the second voltage $U_{Ref2}$ measurable at the reference capacitor 30 now is lower than the (first) reference voltage $U_{Ref1}$, as the total capacity of the capacitors 20, 30 connected in parallel ($C_{Ref}+C_{Sen}$) is higher than the capacity $C_{Ref}$ of the reference capacitor 30 alone:

$$U_{Ref2} = Q/(C_{Ref}+C_{Sen})$$

Based on the foregoing context, now the current capacity $C_{Sen}$ of the sensor capacitor 26 can be easily calculated:

$$C_{Ref}*U_{Ref1} = (C_{Ref}+C_{Sen})+U_{Ref2}$$

$$C_{Sen} = C_{Ref}*(U_{Ref1}-U_{Ref2})/U_{Ref2}$$

With a known capacitance $C_{Ref}$ of the reference capacitor 30, thus only each of the direct current voltages $U_{Ref1}$ and $U_{Ref2}$ have to be measured so as to be able to determine the current capacitance of the sensor capacitor 28.

The afore-described cycles are continuously repeated at short intervals, e.g. of two milliseconds. The continuous determination of the capacitance $C_{Sen}$ of the sensor capacitor 26 allows for sensing changes of said capacitance. By way of carefully defined threshold values which may be based on empirically established empirical values, contact and/or release of the steering wheel 10 can be concluded when said threshold values are underrun or exceeded.

A more sophisticated evaluation already enables an approach to the steering wheel 10 and/or a removal from the steering wheel 10 to be sensed. Also, a distinction can be made between a contact/approach by the hand and a contact/approach by a finger.

If plural first electrodes 12 galvanically isolated against each other are arranged on the steering wheel 10, the evaluation of all sensor capacitors 26 formed in this way may provide information about the point of the steering wheel 10 at which contact occurs and about whether one or two hands are in contact with the steering wheel 10. Moreover, also gestures such as moving a hand along the steering wheel rim 14 can be sensed.

The results of evaluation may be supplied to different vehicle assistance systems as input parameters.

For suppressing interferences the metallic steering wheel rim 16 or another electric conductor arranged between the steering wheel armature 16 and the first electrode 12 can be used as a shielding. Passive shielding is achieved in that said electric conductor is placed on a constant potential or ground. In this way, especially the charging and discharging operations at the capacitors 26, 30 and thus the evaluation of the voltages measured are getting more robust against interferences. In addition or as an alternative, active shielding may be provided in which said electric conductor is charged to a potential suited for interference suppression when connecting the sensor capacitor 26 and the reference capacitor 30 in parallel as afore-described.

The first electrode 12 of the sensor capacitor 26 may at the same time be a heating element of a steering wheel heating system or it may be connected to such system or a similar system.

In addition or as an alternative, the at least one electrode 12 may as well be arranged on the airbag module of the steering wheel 10, especially within or beneath the upper cover thereof.

LIST OF REFERENCE NUMERALS

10 steering wheel
12 first electrode
14 steering wheel rim
16 steering wheel armature
18 foam-coating
20 wrapping
22 wires
24 evaluation circuit
26 sensor capacitor
28 second switch
30 reference capacitor
32 first switch
34 direct current voltage source
36 second electrode
T toroidal peripheral direction
P poloidal peripheral direction

The invention claimed is:

1. A device for detecting steering wheel contact comprising:
    at least one first electrode (12) which is provided in a steering wheel (10) and which forms, together with a human body acting as a second electrode and a dielectric situated therebetween, at least one sensor capacitor (26), and
    an evaluation circuit (24) having
    a reference capacitor (30) of known capacitance which is selectably connected in parallel to the sensor capacitor (26) through a first switch (32), and
    a direct current voltage source (34) which is selectably connected to the reference capacitor (30) through a second switch (28),
    the direct current voltage source (34) being connected to the reference capacitor (30) through the second switch (28) when the second switch (28) is closed and the first switch (32) is open, the reference capacitor (30) being separated from the direct current voltage source (34) and connected in parallel to the at least one sensor capacitor (26) through the first switch (32) when the second switch (28) is open and the first switch (32) is closed,
    wherein voltage at the reference capacitor (30) is measured to detect steering wheel contact.

2. The device according to claim 1, wherein the evaluation circuit is arranged at least partially on a chip.

3. The device according to claim 1, wherein a metallic armature (16) of the steering wheel (10) or an electric conductor arranged between the steering wheel armature (16) and the first electrode (12) is placed on a constant potential or ground.

4. The device according to claim 1, wherein the evaluation circuit is arranged so that a metallic armature (16) of the steering wheel (10) or an electric conductor arranged between the steering wheel armature (16) and the first electrode (12) is charged to a predetermined potential when the sensor capacitor (26) and the reference capacitor (30) are connected in parallel.

5. The device according to claim 1, wherein plural first electrodes (12) arranged to be spread over the steering wheel rim (14) are provided.

6. The device according to claim 1, wherein the first electrode (12) is formed by an electric conductor arranged in a steering wheel rim (14) of the steering wheel (10).

7. The device according to claim 6, wherein the electric conductor includes one or more wires (22).

8. The device according to claim 6, wherein the electric conductor includes one or more conductive tapes or bundles of plural strands.

9. The device according to claim 6, wherein the electric conductor includes an electrically conductive lacquer or an electrically conductive paste.

10. The device according to claim 6, wherein the electric conductor includes a metal plate or film.

11. The device according to claim 6, wherein the electric conductor is arranged within a foam-coating (18) which surrounds a steering wheel armature (16).

12. The device according to claim 6, wherein the electric conductor is applied to foam-coating (18) which surrounds a steering wheel armature (16).

13. The device according to claim 6, wherein the electric conductor is arranged directly beneath an outer wrapping (20) of the steering wheel rim (20).

14. The device according to claim 6, wherein the electric conductor extends substantially along the toroidal peripheral direction of the steering wheel rim (14).

15. The device according to claim 6, wherein the electric conductor extends substantially along the poloidal peripheral direction of the steering wheel rim (14).

16. The device according to claim 6, wherein the electric conductor is part of a metallic fabric or a metallic knit fabric.

17. The device according to claim 6, wherein the electric conductor is formed of a semiconductor material.

18. The device according to claim 6, wherein the electric conductor is applied to a carrier, especially to a textile, a mat or a film.

19. The device according to claim 18, wherein the electric conductor is fastened to one or both sides of the carrier by pulling through or stitching.

20. A method for detecting steering wheel contact using such device according to claim 1, comprising the following successive steps of:
 charging the reference capacitor (30) by applying a known reference voltage or charging the reference capacitor (30) and subsequently measuring a first voltage at the reference capacitor (30);
 connecting, in parallel, the sensor capacitor (26) to the reference capacitor (30) so that a portion of the charge of the reference capacitor (30) is transmitted to the sensor capacitor (26);
 measuring a second voltage at the reference capacitor (30); and
 determining the capacitance of the sensor capacitor (26) from the known capacitance of the reference capacitor (30), the reference voltage or the first voltage and the second voltage.

21. The method according to claim 20, wherein when the sensor capacitor (26) and the reference capacitor (30) are connected in parallel, an electric conductor serving as a shielding within the steering wheel is charged to a predetermined potential.

22. The method according to claim 20, wherein for sensing steering wheel contact at least one threshold value for the capacitance of the sensor capacitor (26) which is preferably based on empirically established empirical values is resorted to.

23. The method according to claim 20, wherein plural sensor capacitors (26) are monitored by means of the evaluation circuit.

24. The method according to claim 20, wherein the method steps are continuously repeated.

25. The method according to claim 24, wherein the time interval between the repetitions of the method steps is within a range of milliseconds.

* * * * *